US 7,323,746 B2

(12) United States Patent
Park et al.

(10) Patent No.: US 7,323,746 B2
(45) Date of Patent: Jan. 29, 2008

(54) RECESS GATE-TYPE SEMICONDUCTOR DEVICE AND METHOD OF MANUFACTURING THE SAME

(75) Inventors: Won-Mo Park, Gyeonggi-do (KR); Jae-Choel Paik, Gyeonggi-do (KR); Du-Heon Song, Gyeonggi-do (KR); Dong-Hyun Kim, Gyeonggi-do (KR); Chang-Sub Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/228,041

(22) Filed: Sep. 14, 2005

(65) Prior Publication Data

US 2006/0060936 A1     Mar. 23, 2006

(30) Foreign Application Priority Data

Sep. 14, 2004   (KR)   ............. 10-2004-0073371
Apr. 19, 2005   (KR)   ............. 10-2005-0032293

(51) Int. Cl.
*H01L 27/108*   (2006.01)
*H01L 29/94*    (2006.01)

(52) U.S. Cl. ............ 257/330; 257/331; 257/332; 257/401; 257/622; 257/E29.134; 257/E29.135

(58) Field of Classification Search ........ 257/330–332, 257/401, 622, E29.134–136
See application file for complete search history.

(56) References Cited

U.S. PATENT DOCUMENTS 5,559,350 A * 9/1996 Ozaki et al. ............. 257/304

6,144,081 A    11/2000 Hsu et al.
2004/0135176 A1 * 7/2004 Kim ..................... 257/243

FOREIGN PATENT DOCUMENTS

| JP | 58-027363   | 2/1983 |
| JP | 2001-185701 | 7/2001 |
| KR | 2002-0041583 | 6/2002 |
| KR | 2004-0013460 | 2/2004 |
| KR | 2005-0002074 | 1/2005 |

OTHER PUBLICATIONS

English language abstract of Korean Publication No. 2002-0041583, Jun. 3, 2002.

(Continued)

*Primary Examiner*—Matthew E. Warren
(74) *Attorney, Agent, or Firm*—Marger Johnson & McCollom, P.C.

(57) ABSTRACT

A recess gate-type semiconductor device includes a gate electrode having a recessed portion at least partially covering a recess trench in an active region, and source/drain regions disposed in the active region that are separated by the gate electrode. The recess trench is separated from sidewalls of a device isolation region in a first direction and contacts sidewalls of the device isolation region in a second direction. The width of the recess trench of the active region in the second direction may be greater than the width of the source/drain regions in the second direction, and the recessed portion of the gate electrode may have tabs protruding in the first direction at its corners. Therefore, the semiconductor device has excellent junction leakage current and excellent refresh characteristics.

16 Claims, 17 Drawing Sheets

OTHER PUBLICATIONS

English language abstract of Korean Publication No. 2004-0013460, Feb. 14, 2004.
English language abstract of Korean Publication No. 2005-0002074, Jan. 7, 2005.
English language abstract of Korean Publication No. 58-027363, Feb. 18, 2003.
English language abstract of Korean Publication No. 2001-185701, Jul. 6, 2001.

* cited by examiner

US 7,323,746 B2

RECESS GATE-TYPE SEMICONDUCTOR DEVICE AND METHOD OF MANUFACTURING THE SAME

CROSS-REFERENCE TO RELATED APPLICATIONS

This application claims priority from Korean Patent Application No. 10-2004-0073371, filed on 14 Sep. 2004, and Korean Patent Application No. 10-2005-0032293, filed on 19 Apr. 2005, the contents of which are hereby incorporated by reference in their entirety for all purposes.

BACKGROUND

1. Field of the Invention

This disclosure relates to semiconductor devices and more particularly, to a recess gate-type semiconductor device and a method of manufacturing the same.

2. Description of the Related Art

As semiconductor devices become highly integrated, design rules for semiconductor device components decrease. In particular, for semiconductor devices having many transistors, a gate length, which is a standard of the design rule, decreases. Thus, a channel length of the transistor must also decrease. In addition, the decrease in the channel length results in an increased short channel effect, thus increasing an off-current that is present in the transistors. As a result, the refresh characteristics of a semiconductor device such as a memory device may deteriorate.

In order to overcome this problem, methods of extending the channel length while the gate length remains fixed have been researched. For example, a recess channel may be formed in a semiconductor substrate to form a recess gate or a trench gate.

FIG. 1A is a plan diagram illustrating a conventional recess gate-type semiconductor device. FIG. 1B is a sectional diagram illustrating the conventional recess gate-type semiconductor device taken along line I-I' of FIG. 1A.

Referring to FIGS. 1A and 1B, the conventional recess gate-type semiconductor device includes an active region 110 defined by a device isolation region 105 formed in a semiconductor substrate, source/drain regions 150 separated from each other in the active region 110, and a gate electrode 130 that is formed between the source/drain regions 150 and that is insulated form the active region 110 by a gate insulating layer 125.

The gate electrode 130 includes a recessed portion 130a that is recessed into the active region 110, and a protruding portion 130b that protrudes from the active region 110. The active region 110 extends in an $X_1$ direction, and the protruding portion 130b of the gate electrode 130 extends in an $X_2$ direction. As illustrated in FIG. 1B, a gate spacer 145 may be disposed on the sidewall of the gate electrode 130.

A channel region surrounds a lower portion of the recessed portion 130a of the gate electrode 130 in the active region 110. As a result, the channel length may be greater than a width L12 of the protruding portion 130b of the gate electrode 130 in the $X_1$ direction. Accordingly, the channel length of the recess gate-type semiconductor device may be greater than the channel length of a planar-type semiconductor device, thereby preventing short channel effects.

However, active core sharpening in the active region 110 occurs at a boundary portion B of the gate electrode 130, because recess trench etching for forming the recessed portion 130a of the gate electrode 130 occurs more slowly at the boundary portion B and thus the corner of the active region 110 is not sufficiently etched.

Therefore, a width L11 of the recessed portion 130a of the gate electrode 130 is less than a width L13 of the protruding portion 130b of the gate electrode 130. As a result, the portion B of the source/drain regions 150 below an edge of the gate protruding portion 130b are formed to a small thickness with low impurity concentration. In other words, the implantation of impurities to form the source/drain regions 150 is obstructed or screened by the edge of the protruding portion 130b of the gate electrode 130 and the spacer 145.

When a gate voltage is applied to the gate electrode 130 of the semiconductor device, an electric field is focused at the portion B of the source/drain regions 150 below the edge of the protruding portion 130b of the gate electrode 130. Accordingly, a junction leakage current of the source/drain regions 150 increases, degrading the refresh characteristics of the semiconductor device, which may be, for example, a memory device.

Embodiments of the invention address these and other disadvantages of the conventional art.

SUMMARY

According to some embodiments of the invention, a recess gate-type semiconductor device provides good refresh characteristics resulting from a decrease of a junction leakage current. According to other embodiments of the invention, a method of manufacturing a recess gate-type semiconductor device results in a device that provides good refresh characteristics resulting from a decrease of a junction leakage current.

DETAILED DESCRIPTION

Figure 1A:
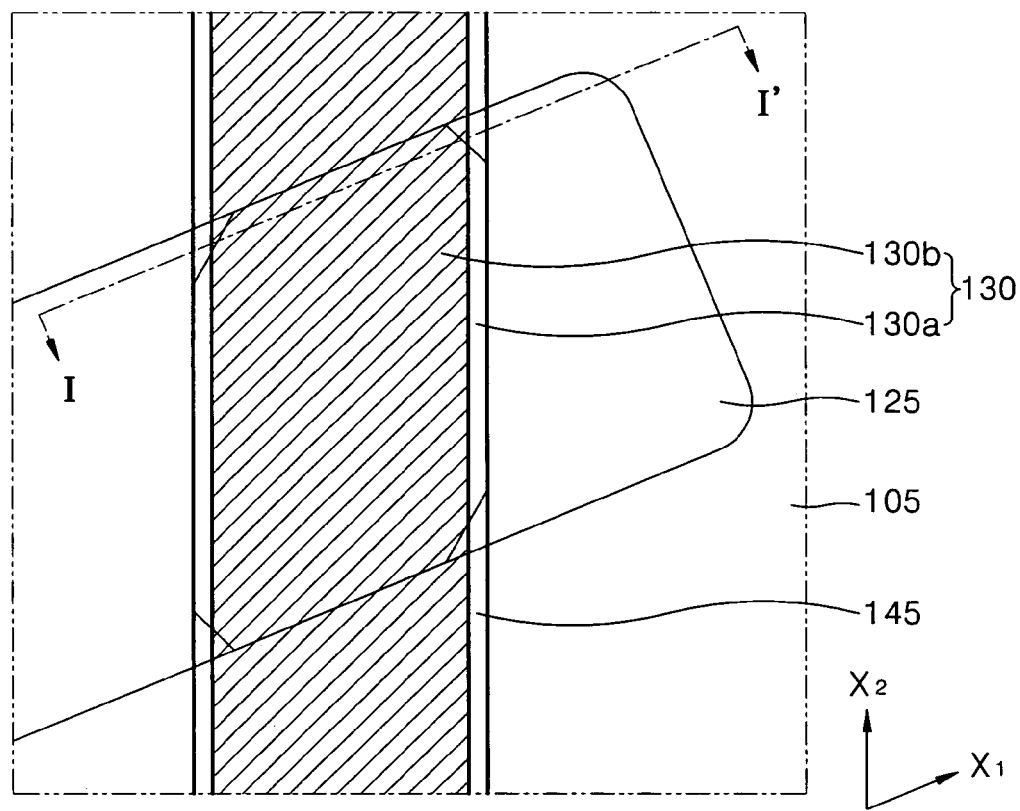
FIG. 1A is a plan diagram illustrating a conventional recess gate-type semiconductor device.
Figure 1B:
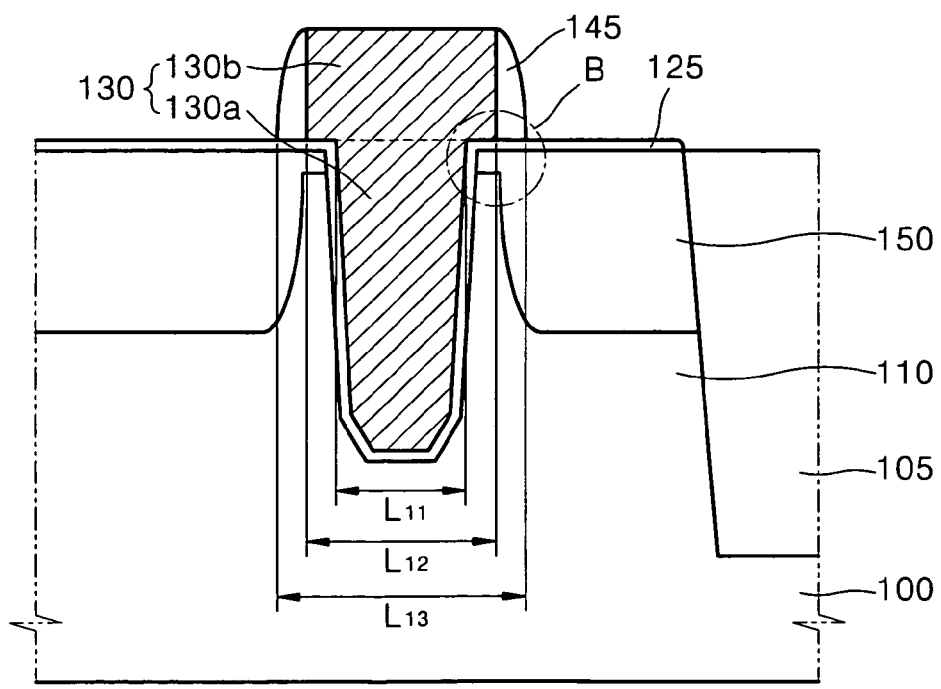
FIG. 1B is a sectional diagram, taken along the line I-I' of FIG. 1A, which further illustrates the device of FIG. 1A.

The invention is described more fully below with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions may be exaggerated for clarity.

Figure 2A:
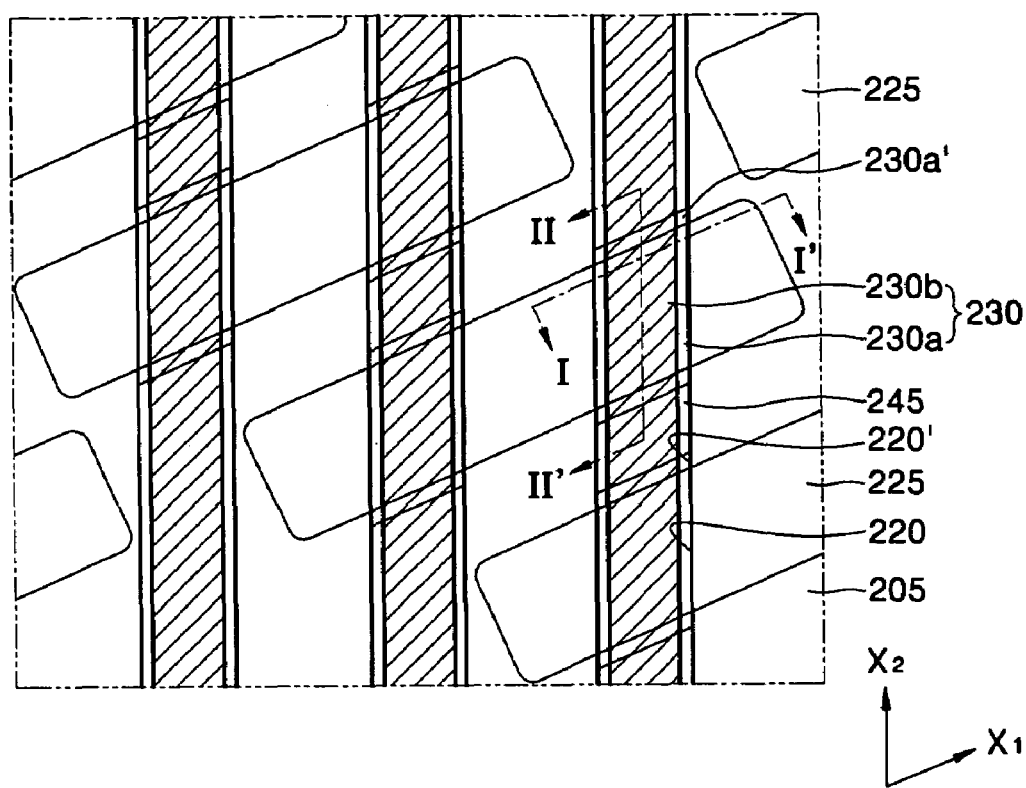
FIG. 2A is a plan diagram illustrating a recess gate-type semiconductor device according to some embodiments of the invention.
Figure 2B:
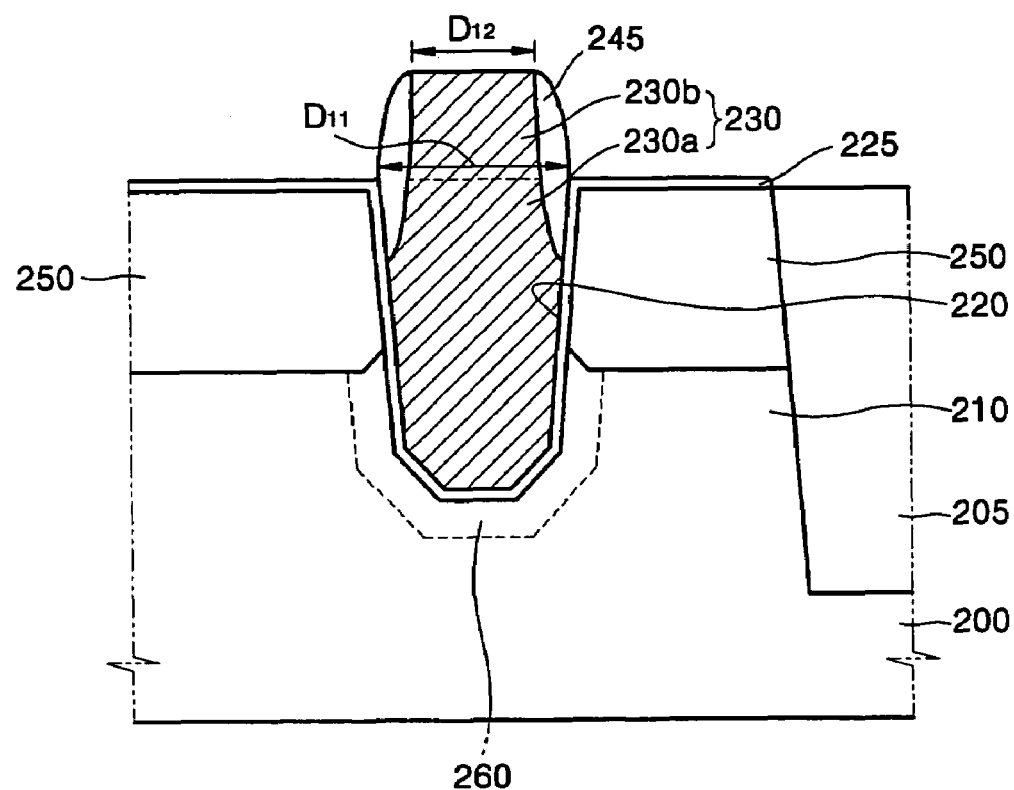
FIG. 2B is a sectional diagram, taken along the line I-I' of FIG. 2A, which further illustrates the device of FIG. 2A.
Figure 2C:
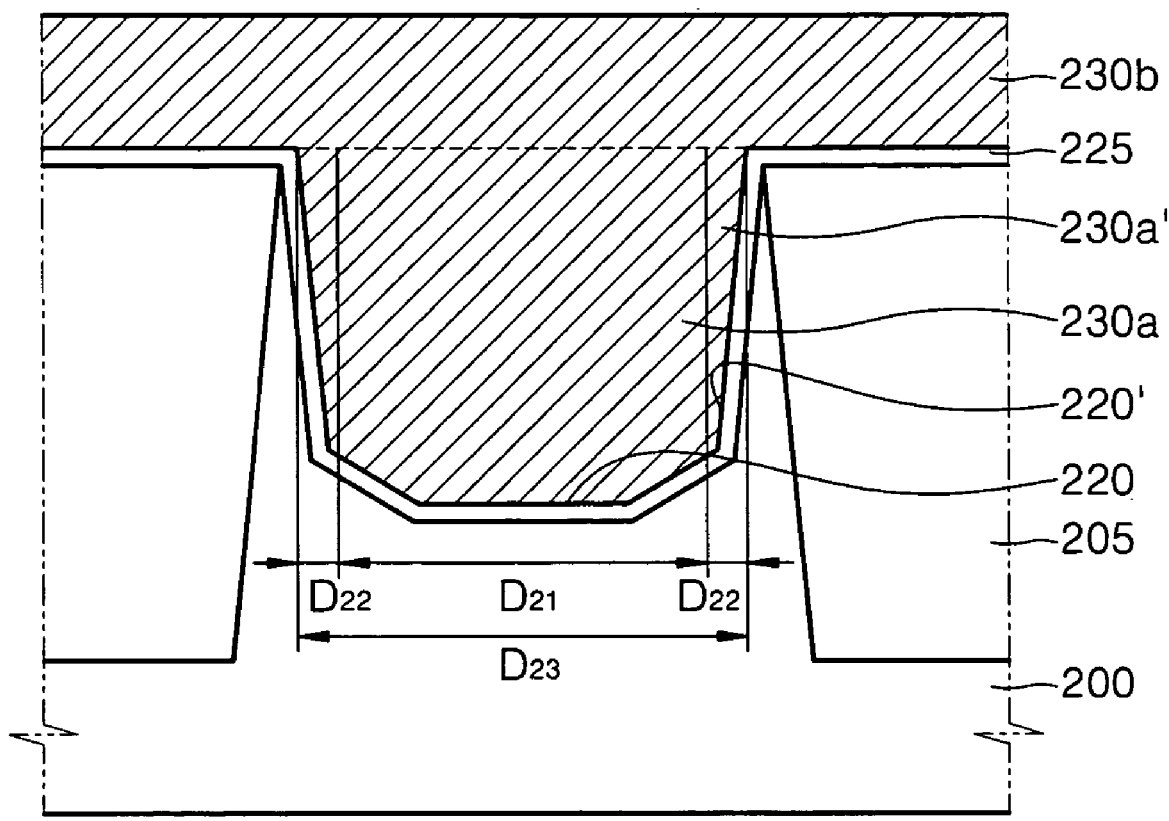
FIG. 2C is a sectional diagram, taken along the line II-II' of FIG. 2A, which further illustrates the device of FIG. 2A.

FIG. 2A is a plan diagram illustrating a recess gate-type semiconductor device according to some embodiments of the invention. FIG. 2B is a sectional diagram, taken along the line I-I' of FIG. 2A, which further illustrates the device of FIG. 2A. FIG. 2C is a sectional diagram, taken along the line II-II' of FIG. 2A, which further illustrates the device of FIG. 2A.

Referring to FIGS. 2A through 2C, a semiconductor device includes an active region 210 formed in an array, and a gate electrode 230 including a recessed portion 230a partially filling a recess trench 220 in the active region 210 and a protruding portion 230b formed above the active region 210. Source/drain regions 250 are separated by the gate electrode 230 in the active region 210. Source/drain regions 250 can function either as a source or alternatively, as a drain. For example, if one source/drain region 250 functions as a source, the other source/drain region 250 on the other side of the gate electrode 230 may act as a drain.

The active region 210 is defined by a device isolation region 205 formed in a semiconductor substrate 200. The device isolation region 205 may be a shallow trench isolation (STI) layer formed of an insulating material, for example, silicon oxide. The active region 210 has a predetermined width and extends in an $X_1$ direction. The active region 210 includes the recess trench 220 that is separated from sidewalls of the device isolation region 205 by a predetermined distance in the $X_1$ direction, and contacts the device isolation region 205 in the $X_2$ direction.

A channel region 260, as shown in FIG. 2B, is formed along the active region 210 below the recessed portion 230a, and is connected to the source/drain regions 250. The length of the channel region 260 is greater than the width D12 of the protruding portion 230b, that is, greater than a channel length of a planar gate electrode structure. As a result, a short channel effect can be prevented.

The recess trench 220 may further include first hole tabs 220' along its edges so that the width of the recess trench 220 in the $X_2$ direction is greater than the width of the source/drain regions 250 in the $X_2$ direction. The width of the first hole tab 220' in the $X_1$ direction may be equal to the width of the recess trench 220 but the first hole tab 220'. In addition, the edge of the first hole tab 220' may be round, and the width of the first hole tab 220' may be equal to or less than the width of the recess trench 220. However, since the first hole tab 220' is formed at the edge of the recess trench 220, the width of the recess trench 220 in the $X_1$ direction, between the source/drain regions 250, may be maintained constant.

The protruding portion 230b is connected to the recessed portion 230a, and extends linearly in the $X_2$ direction. To increase the integrity of the semiconductor device, the $X_1$- and $X_2$-directions may be aligned to form an acute angle of 30° up to 90°, and preferably, may be aligned to form angles of 40° to 80°.

The recessed portion 230a may entirely or partially fill the recess trench 220. Accordingly, the recessed portion 230a includes a first tab 230a' covering the first hole tab 220', and thus, as shown in FIG. 2C, the width D23 of the recessed portion 230a in the $X_2$ direction is equal to the width D21 of the source/drain regions 250 in the $X_2$ direction plus two times the width D22 of the first tab 230a' in the $X_2$ direction.

The width D11 of the recessed portion 230a between the source/drain regions 250 in the $X_1$ direction can be maintained constant because the recess trench 220 between the source/drain regions 250 is formed with a predetermined width in the $X_1$ direction. Accordingly, the width D11 of the recessed portion 230a between the source/drain regions 250 in the $X_1$ direction is greater than the width D12 of the protruding portion 230b in the $X_1$ direction. Therefore, the gate electrode 230 between the source/drain regions 250 has an inner gate structure. Accordingly, a region in which an electric field is focused is not generated, a junction leakage current is small, and thus refresh characteristics are good.

However, the edge of the first tab 230a' formed by filling the first hole tab 220' can be round. In this case, the width of the edge of the first tab 230a' in the $X_1$ direction can be equal to or less than the width of the protruding portion 230b in the $X_1$ direction. However, since the edge of the first tab 230a' does not directly contact the source/drain regions 250, the junction leakage current and refresh characteristics are not substantially influenced.

A gate insulating layer 225 insulates the gate electrode 230 from the active region 210. The gate insulating layer 225 can be interposed between the gate electrode 230 and the active region 210 and between the source/drain regions 250.

In the recess gate-type semiconductor device according to the present embodiment, the gate electrode 230 between the source/drain regions 250 has the inner gate structure, and thus junction leakage current characteristics and refresh characteristics are excellent.

FIGS. 3A, 4A, 5A, 6A and 7A are plan diagrams illustrating a method of manufacturing the device of FIG. 2A according to some embodiments of the invention. FIGS. 3B, 4B, 5B, 6B and 7B are sectional diagrams, taken along the lines I-I' of FIGS. 3A, 4A, 5A, 6A and 7A, respectively, which further illustrate the method of manufacturing the device of FIG. 2A according to some embodiments of the invention.

Figure 3A:
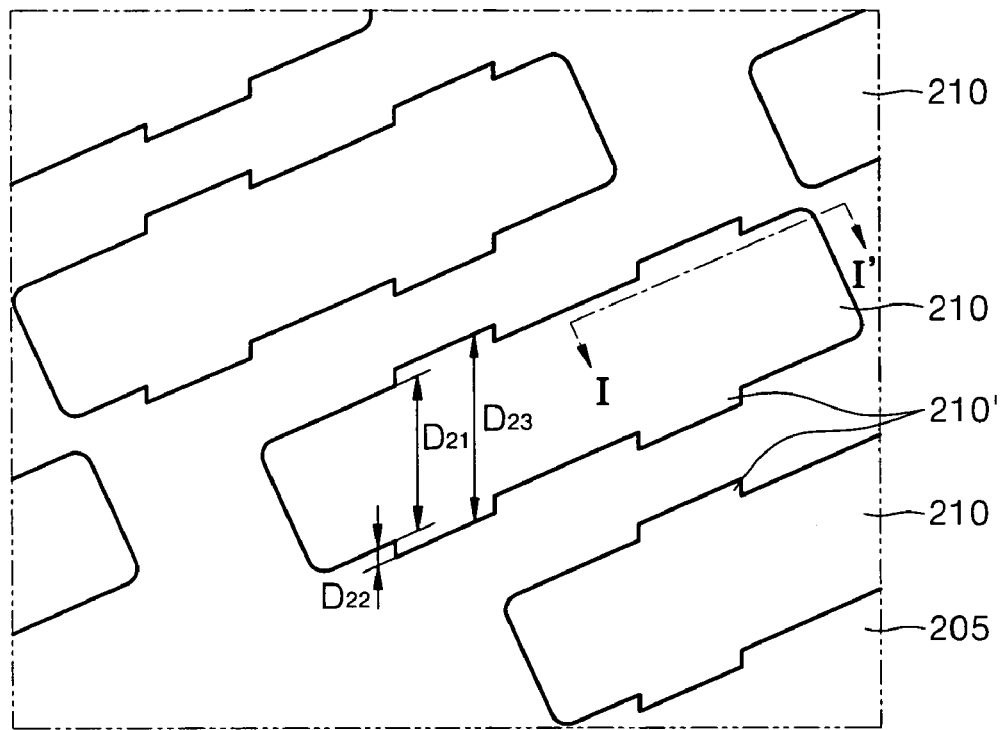
FIGS. 3A, 4A, 5A, 6A and 7A are plan diagrams illustrating a method of manufacturing the device of FIG. 2A according to some embodiments of the invention.
Figure 3B:
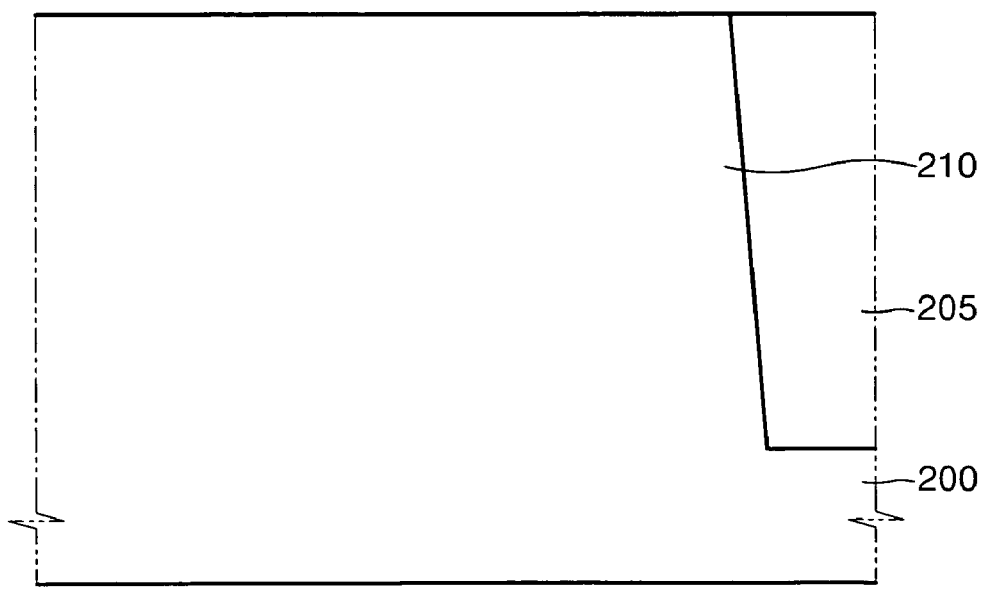
FIGS. 3B, 4B, 5B, 6B and 7B are sectional diagrams, taken along the lines I-I' of FIGS. 3A, 4A, 5A, 6A and 7A, respectively, which further illustrate the method of manufacturing the device of FIG. 2A according to some embodiments of the invention.

Referring to FIGS. 3A and 3B, the device isolation region 205 is formed in the semiconductor substrate 200 to define the active region 210. The active region 210 extends in the $X_1$ direction, and includes a pair of tabs 210' that extend outwardly from the active region in the $X_2$ direction. That is, the width D23 of a portion of the active region 210 in which the tab 210' is included, can be equal to the width 21 of a portion of the active region 210 in which the tab 210' is not included plus two times the width D22 of the tab 210'. The tabs 210' increase the widths of the recess trench 220 and the gate electrode 230 in the $X_2$ direction.

Figure 4A:
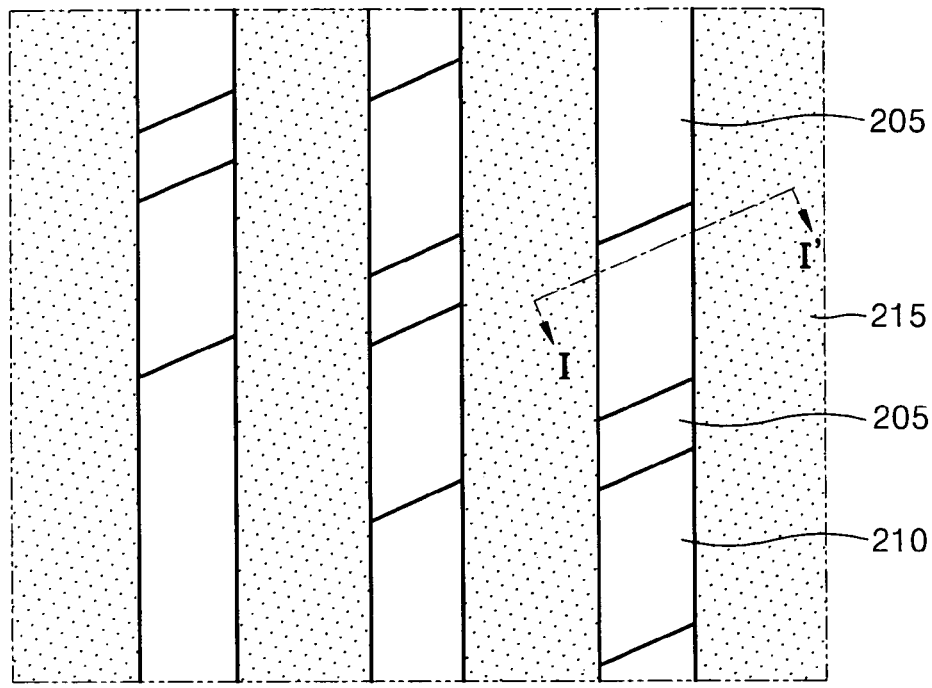
Figure 4B:

Referring to FIGS. 4A and 4B, a photoresist pattern 215 exposing the tabs 210' and the active region 210 between the tabs 210' is formed. The photoresist pattern 215 may be formed by forming a photoresist layer (not shown) on a surface of the active region 210 and then patterning the photoresist layer by exposure or development. The photoresist pattern 215 may extend linearly in the $X_2$ direction.

Figure 5A:
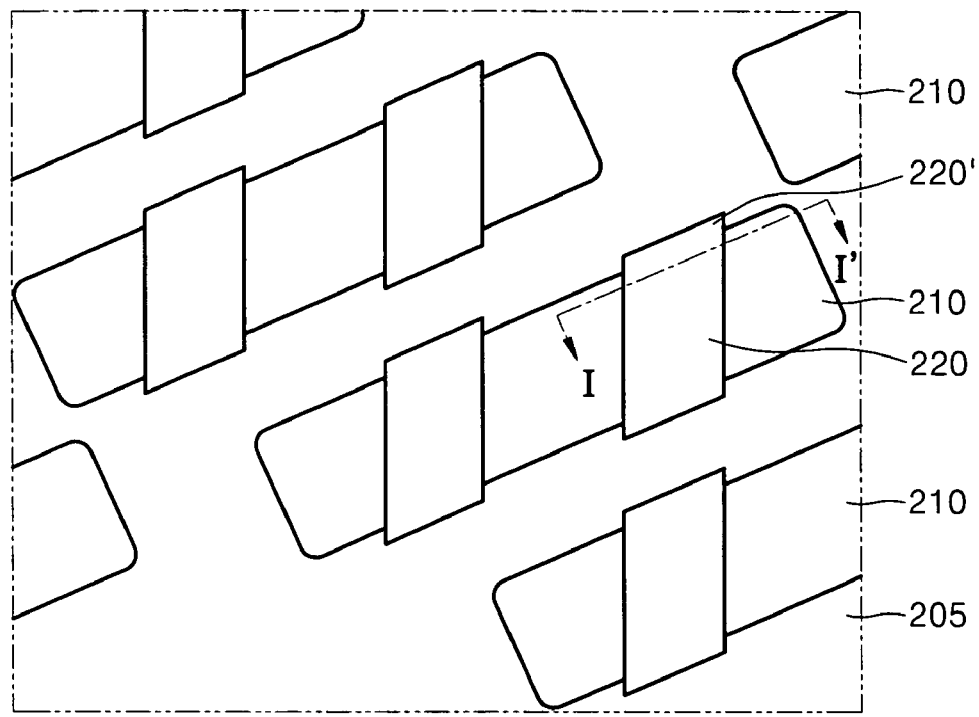
Figure 5B:
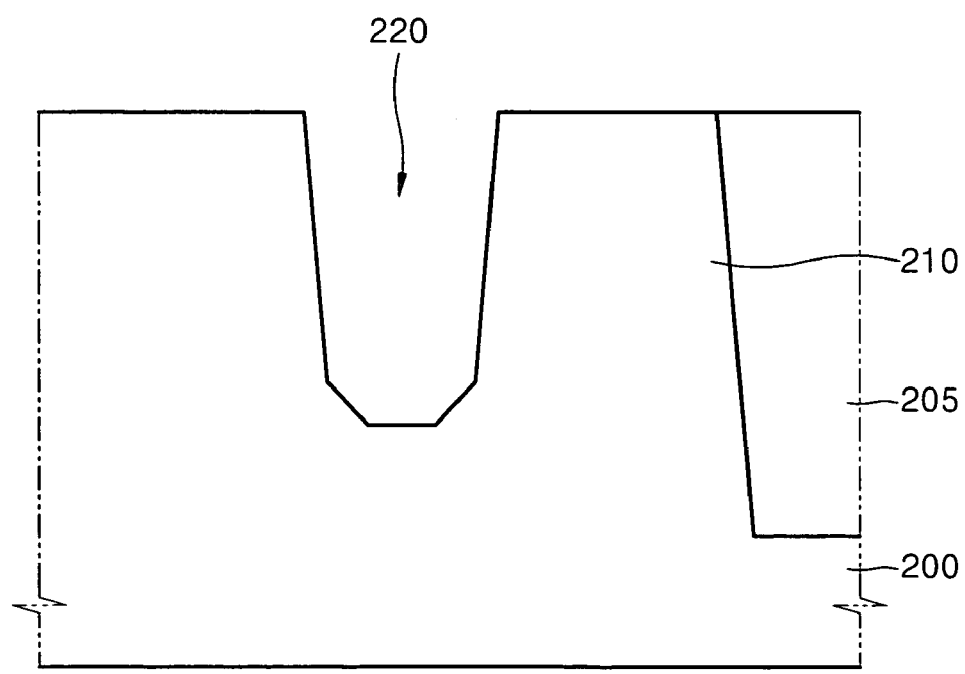

Referring to FIGS. 5A and 5B, the recess trench 220 is formed by etching the exposed active region 210 using the photoresist pattern 215 as an etch protecting layer, and then the photoresist pattern 215 is removed. The etch selectivity between the device isolation region 205 and the active region 210 may be such that the device isolation region 205 exposed by the photoresist pattern 215 is not etched and only the exposed active region 210 is etched. The etch selectivity can be controlled by using an appropriate etch gas.

The recess trench 220 includes the hole tab 220', which is formed by etching the tab 210'. Accordingly, the width of the recess trench 220 in the $X_2$ direction is greater than the width of the adjacent active region 210 in the $X_2$ direction.

Figure 6A:
Figure 6B:
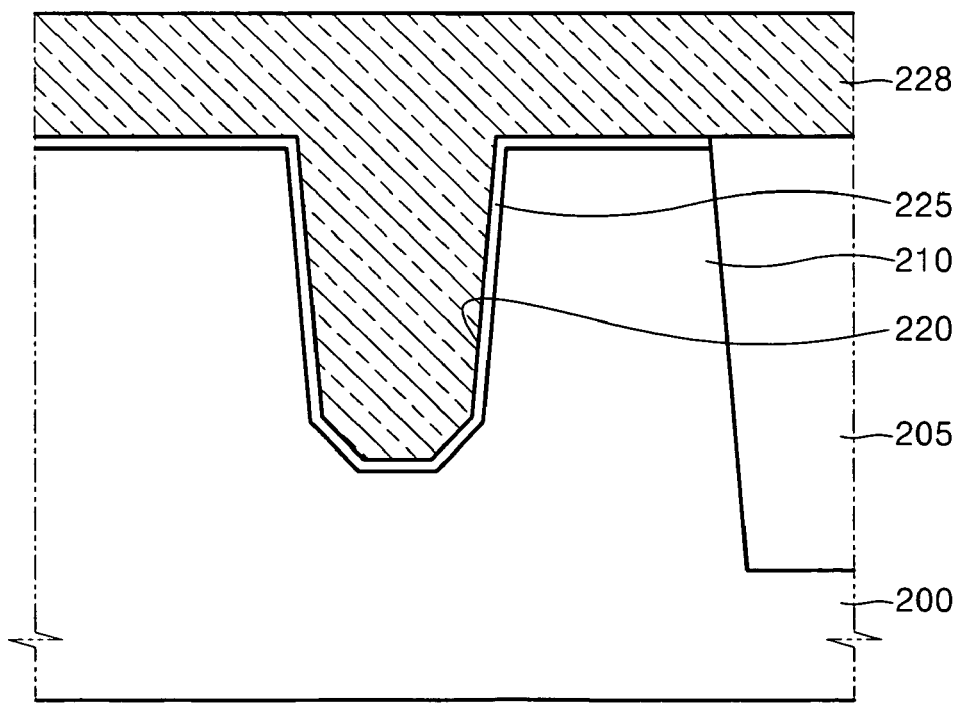

Referring to FIGS. 6A and 6B, the gate insulating layer 225 is formed on a surface of the active region 210 including a surface of the recess trench 220. Then, a gate electrode layer 228 is formed on the gate insulating layer 225 to fill the recess trench 220. The gate insulating layer 225 may be a thermal oxide layer formed by a thermal oxidation process, or an oxide layer may be formed by a chemical vapor deposition (CVD) process. Although not shown in FIG. 6B, when the gate insulating layer 225 is formed by CVD, the gate insulating layer 225 may be formed on the device isolation region 205.

The gate electrode layer 228 may be formed of polysilicon, Al, W, TiN, Ta, Pt, or a composite of these. The gate electrode layer 228 may further include a metal silicide layer (not shown) on the polymer silicon to decrease resistance. Examples of the metal silicide may include W, Co, Ti, Ni, and the like.

At this point, the gate electrode 228 may be optionally planarized by an etch-back or chemical mechanical polishing (CMP) process.

Figure 7A:
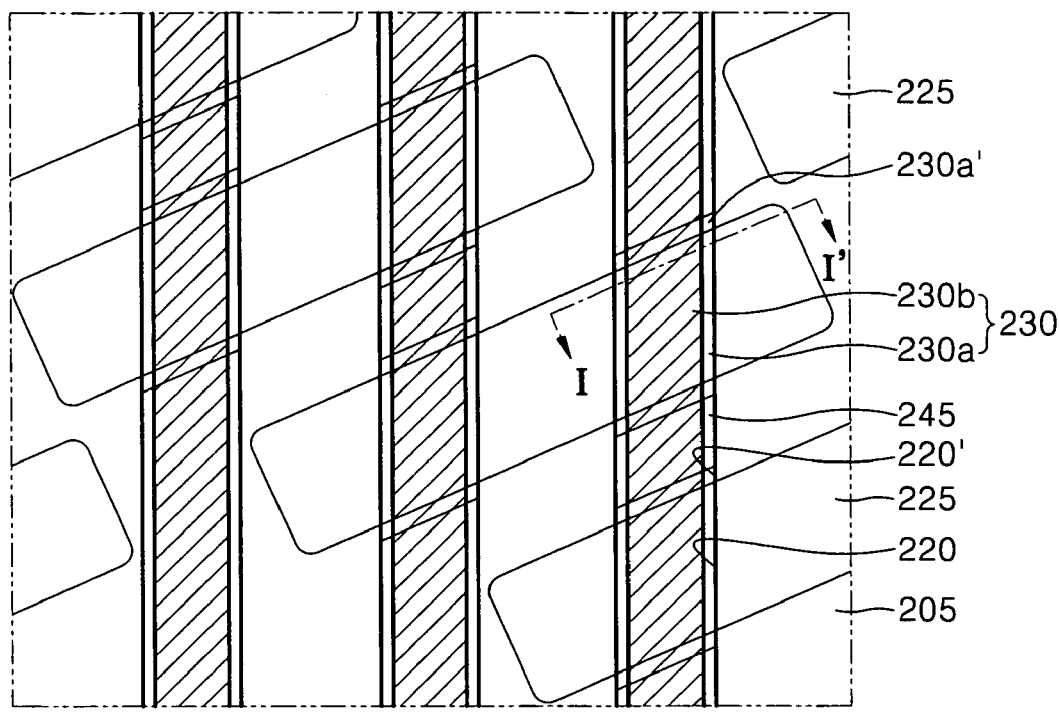
Figure 7B:
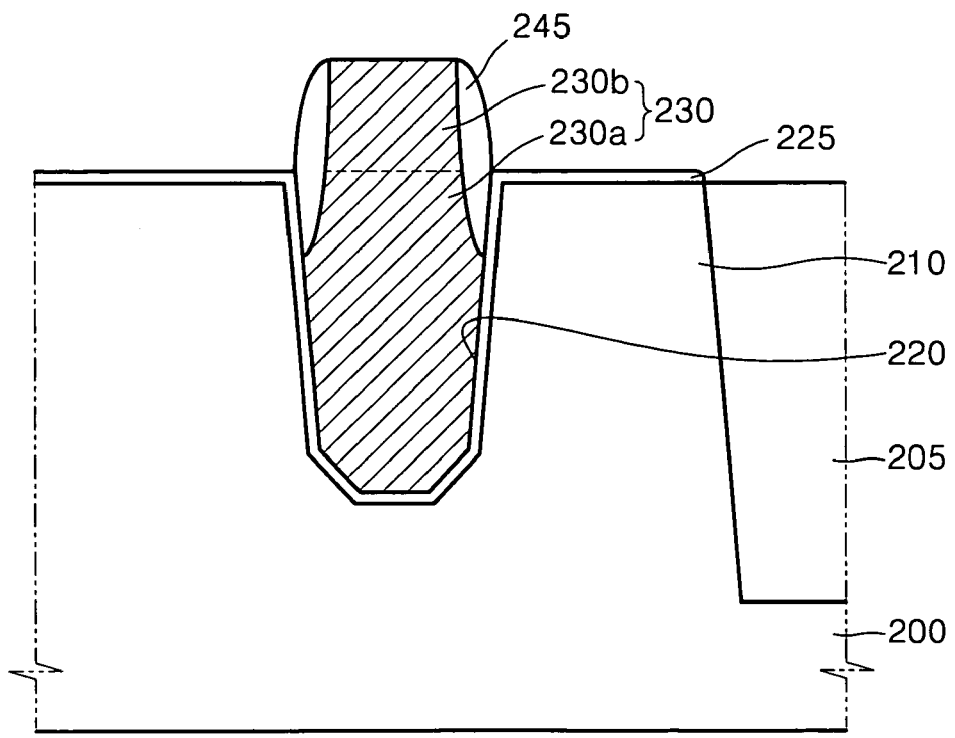

Referring to FIGS. 7A and 7B, the gate electrode 230 is formed by patterning the gate electrode layer 228. Then, a gate spacer 245 can be formed on sidewalls of the gate electrode 230. The operation of patterning of the gate electrode 230 may include forming a second photoresist pattern (not shown) on the entire surface of the gate electrode layer 228, and etching the gate electrode layer 228 using the second photoresist pattern as an etch protecting layer. At this time, excess etching can be performed such that a part of the active region 210 below the recess trench is exposed. The etching can be performed such that the distance between the sidewall of the gate electrode 230 and the surface of the active region 210 is in the range of 100 Å to 200 Å.

The gate electrode 230 in the recess trench 220 includes a recessed portion 230a and a protruding portion 230b that extends above the active region 210. The width of the protruding portion 230b in the $X_1$ direction may be less than the width of the recessed portion 230a in the $X_1$ direction. In addition, the protruding portion 230b may extend linearly in the $X_2$ direction. Accordingly, the protruding portion 230b may overlap the active region 210 formed in an array. In addition, the recessed portion 230a may include the first tab 230a' formed by filling the hole tab 220'.

Then, according to a method known to those skilled in the art, the source/drain regions 250 (illustrated in FIG. 2) separated by the gate electrode 230 can be formed in the active region 210. Subsequently, a metal interconnection line is formed using a conventional method, thus forming a semiconductor device. When the semiconductor device is a DRAM device, a capacitor can be further formed before the metal interconnection line is formed.

According to the above method of manufacturing the semiconductor device, the width of the active region 210 in the $X_2$ direction can be increased by forming the tab 210', and thus the widths of the recess trench 220 and the recessed portion 230a in the $X_2$ direction are increased. As a result, the gate electrode 230 between the source/drain regions has the inner gate structure. Accordingly, a semiconductor device manufactured in accordance with the embodiments described above has excellent (low) junction leakage current and refresh characteristics.

Figure 8A:
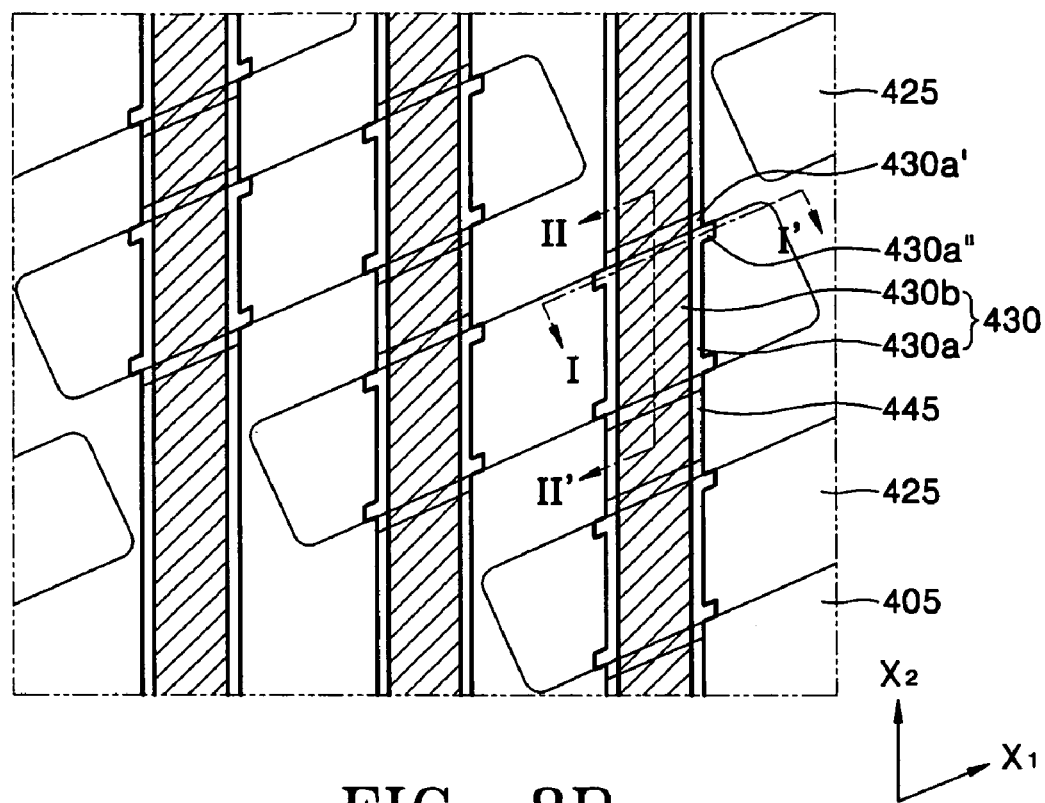
FIG. 8A is a plan diagram illustrating a recess gate-type semiconductor device according to other embodiments of the invention.
Figure 8B:
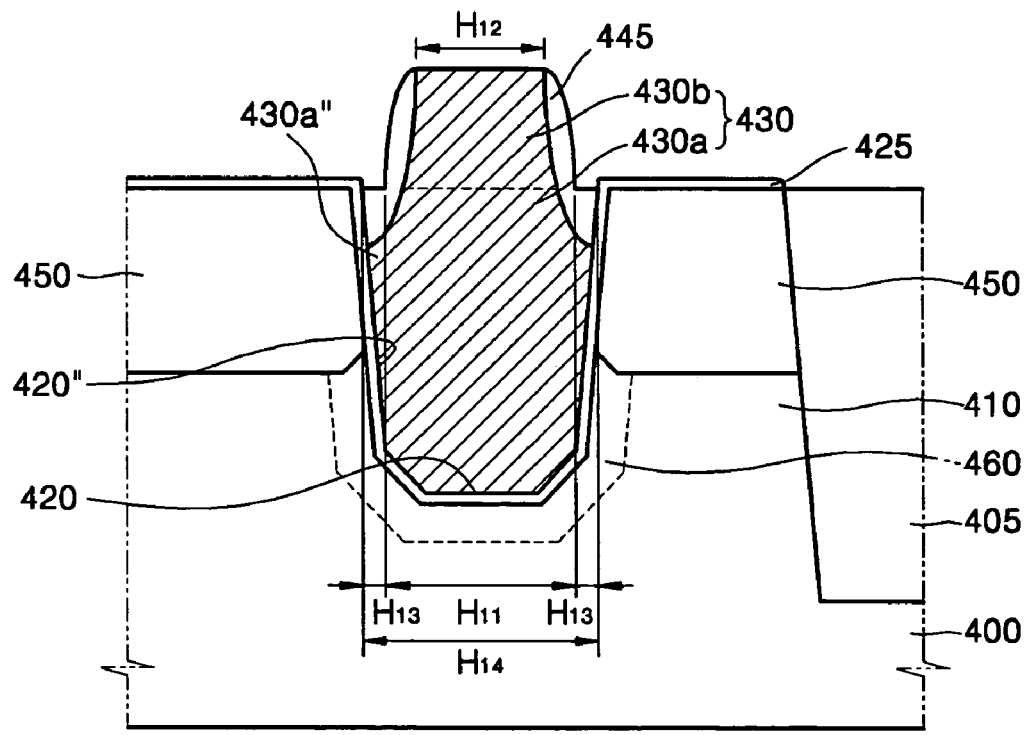
FIG. 8B is a sectional diagram, taken along the line I-I' of FIG. 8A, which further illustrates the device of FIG. 8A.
Figure 8C:
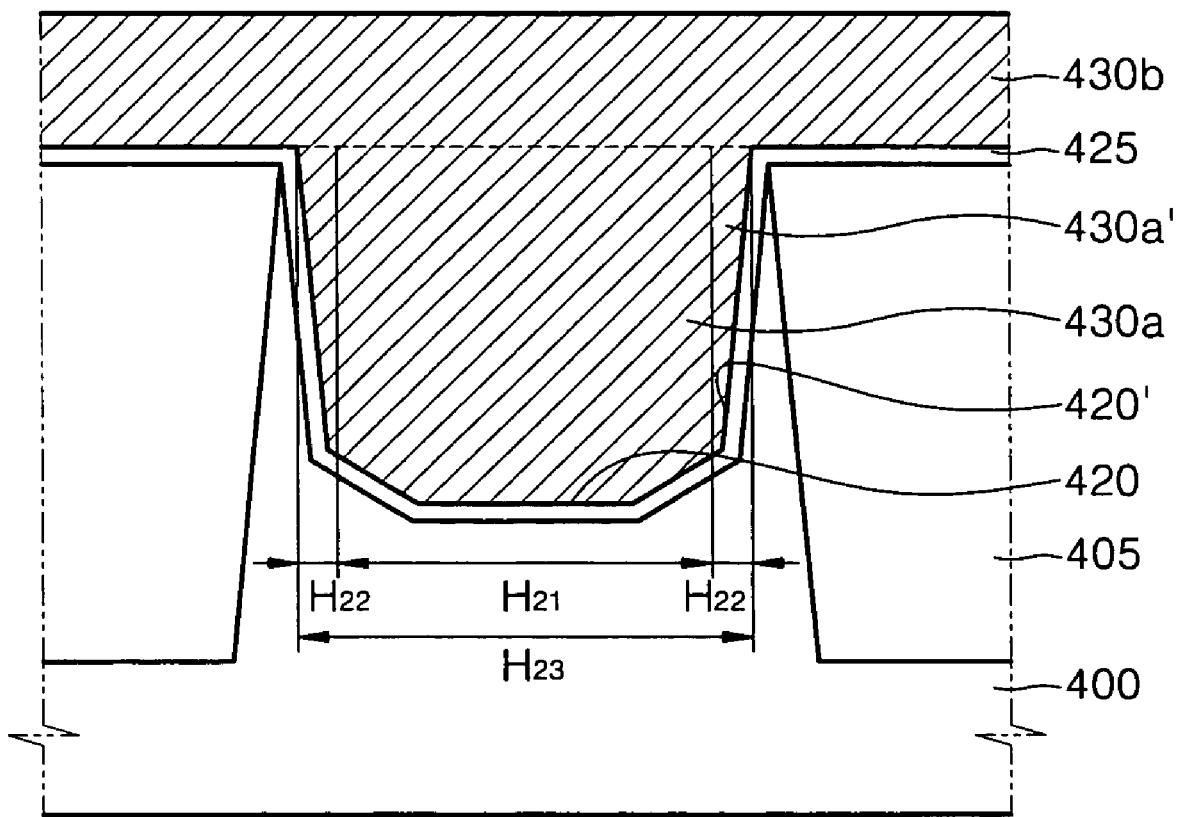
FIG. 8C is a sectional diagram, taken along line II-II' of FIG. 8A, which further illustrates the device of FIG. 8A.

FIG. 8A is a plan diagram illustrating a recess gate-type semiconductor device according to other embodiments of the invention. FIG. 8B is a sectional diagram, taken along the line I-I' of FIG. 8A, which further illustrates the device of FIG. 8A. FIG. 8C is a sectional diagram, taken along line II-II' of FIG. 8A, which further illustrates the device of FIG. 8A.

When compared to the embodiments of FIGS. 2A-2C, the embodiments illustrated in FIGS. 8A-8C share many similarities. Accordingly, in the description of FIGS. 8A-8C that appears below, the portions of the semiconductor device that may be understood with reference to FIGS. 2A-2C are not described in great depth and in some cases a description may be absent altogether. Thus, reference numerals for identical or similar elements shared by both the embodiments of FIGS. 2A-2C and FIGS. 8A-8C differ only in the most significant digit. In the description of FIGS. 8A-8C that appears below, emphasis will be placed on the portions of the embodiments that are different from the embodiments illustrated in FIGS. 2A-2C.

Referring to FIGS. 8A, 8B and 8C, a semiconductor device includes an active region 410 formed in an array, and a gate electrode 430 including a recessed portion 430a that partially fills a recess trench 420 in the active region 410 and a protruding portion 430b formed on the active region 410. Source/drain regions 450 are separated by the gate electrode 430 in the active region 410. The gate insulating layer 425 insulates the gate electrode 430 from the active region 410.

The active region 410 is defined by a device isolation region 405 formed in the semiconductor substrate 400. In the active region 410, the recess trench 420 is separated from the sidewalls of the device isolation region 405 in the $X_1$ direction by a predetermined distance and contacts the device isolation region 405 in the $X_2$ direction. A channel region 460 is formed in the active region 410 below the recessed portion 430a and can be connected to the source/drain regions 450.

The recess trench 420 includes first hole tabs 420' along its edge such that the width of the recess trench 420 in the $X_2$ direction is greater than the width of the source/drain regions 450 in the $X_2$ direction. The width of the first hole tab 420' in the $X_1$ direction can be equal to the width of a non-tab portion of the recess trench 420 in the $X_1$ direction. In addition, the recess trench 420 may further include second hole tabs 420" protruding from corners of a portion of the recess trench contacting the source/drain regions 450 such that the width of the recess trench 420 in the $X_1$ direction is increased. An edge of the second hole tab 420" may contact the device isolation region 405.

The protruding portion 430*b* is connected to the recessed portion 430*a*, and extends linearly in the $X_2$ direction. The recessed portion 430*a* entirely or partially fills the recess trench 420. Accordingly, the recessed portion 430*a* can include a first tab 430*a*' covering the first hole tab 420' and a second tab 430*a*" covering the second hole tab 420". Accordingly, as shown in FIG. 8C, the width H23 of the recessed portion 430*a* in the $X_2$ direction is equal to the width H21 of the source/drain regions 450 in the $X_2$ direction plus two times the width H22 of the first tab 430*a*' in the $X_2$ direction.

Referring to FIG. 8B, the width H14 in the $X_1$ direction of a portion of the recessed portion 430*a* where the second tab 430*a*" is included can be equal to the width H11 of a non-tab portion of the recessed portion 430*a* plus two times the width H13 of the second tab 430*a*". The width H11 can be greater than the width H12 of the protruding portion 430*b*. Accordingly, when compared with the gate electrode 230 according to the previous embodiment, the gate electrode 430 between the source/drain regions 450 may have a more inner gate structure, and thus junction leakage current characteristics and refresh characteristics can be more improved.

Figure 9A:
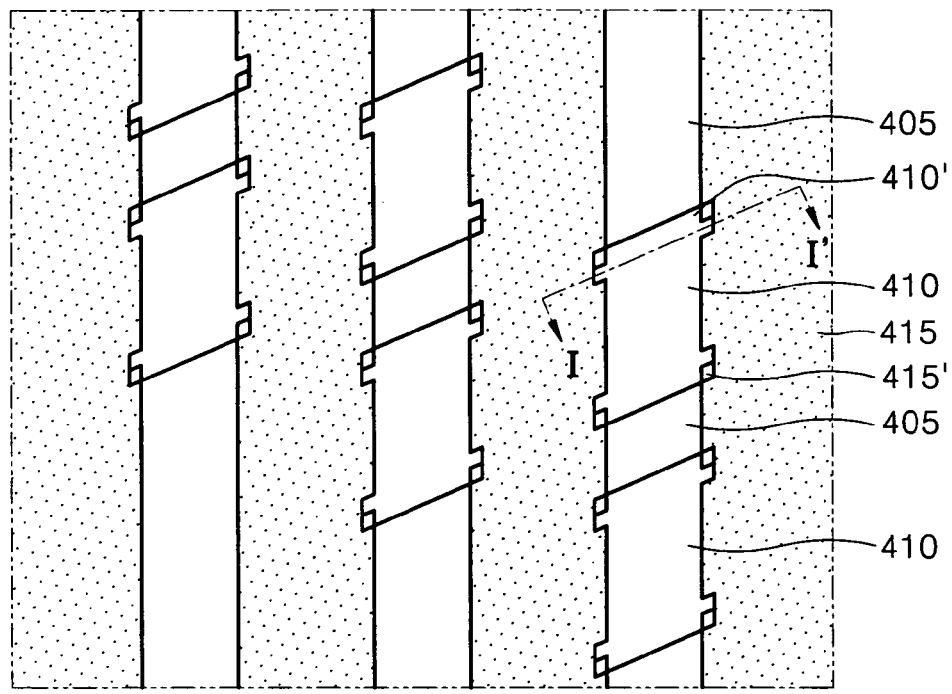
FIGS. 9A, 10A and 11A are plan diagrams illustrating a method of manufacturing the device of FIG. 8A according to other embodiments of the invention.
Figure 9B:
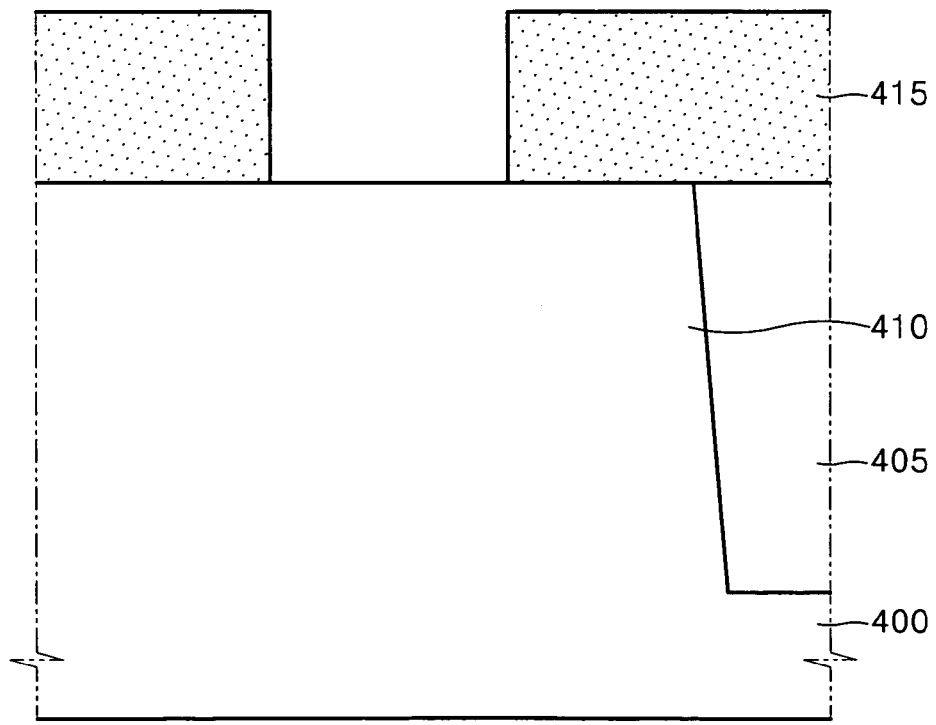
FIGS. 9B, 10B and 11B are sectional diagrams, taken along the lines I-I' of FIGS. 9A, 10A and 11A, respectively, which further illustrate the method of manufacturing the device of FIG. 8A according to some embodiments of the invention.
Figure 10A:
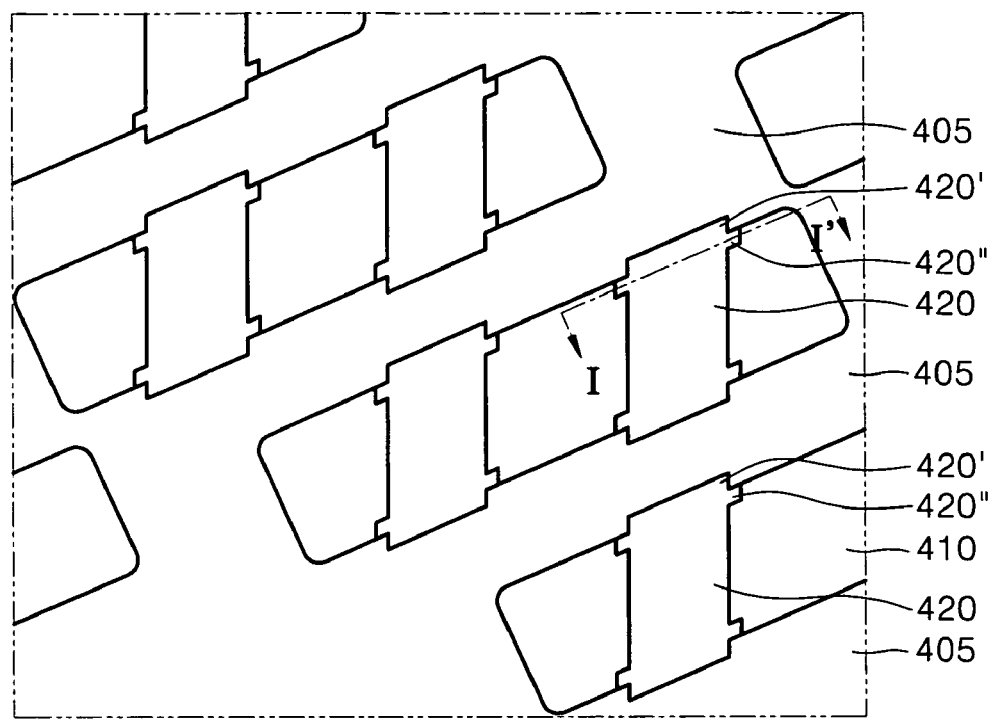
Figure 10B:
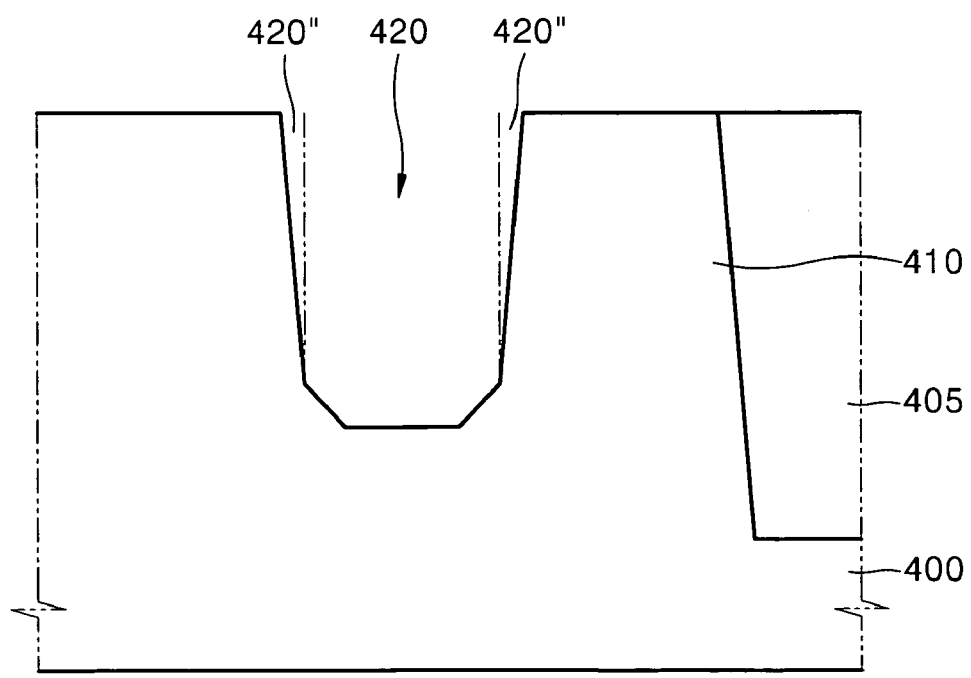
Figure 11A:
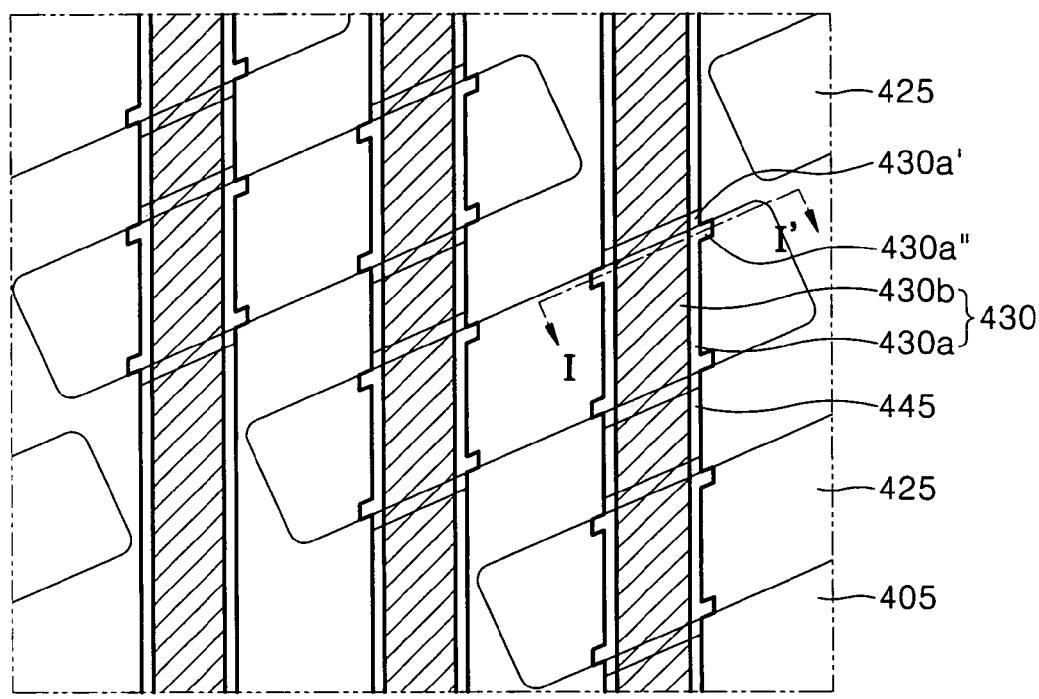
Figure 11B:
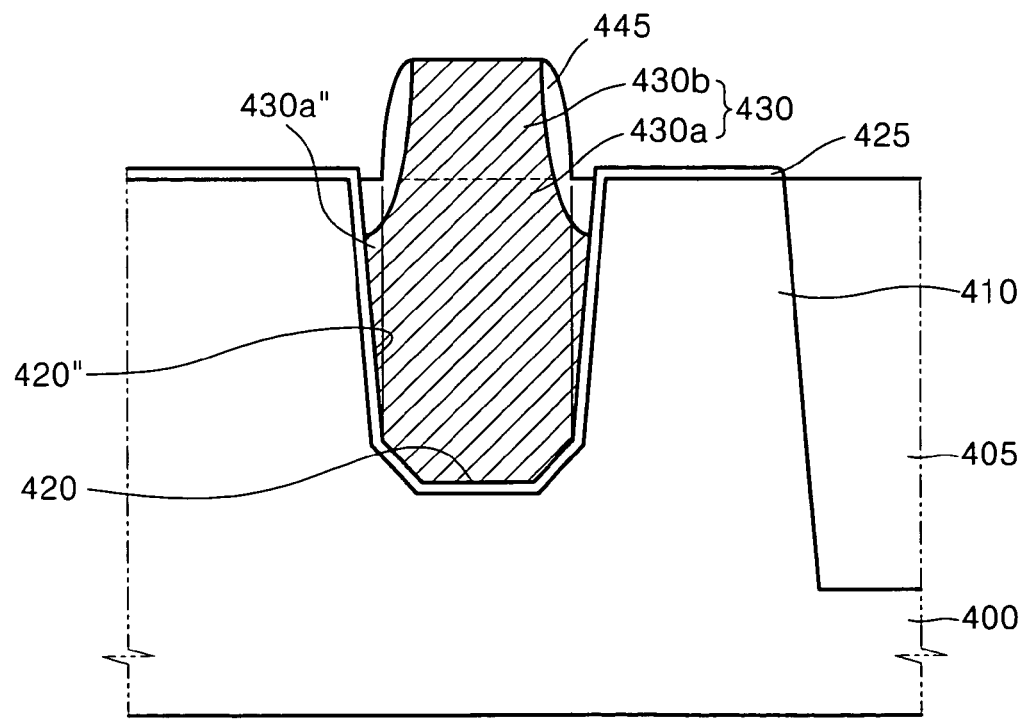

FIGS. 9A, 10A and 11A are plan diagrams illustrating a method of manufacturing the device of FIG. 8A according to other embodiments of the invention. FIGS. 9B, 10B and 11B are sectional diagrams, taken along the lines I-I' of FIGS. 9A, 10A and 11A, respectively, which further illustrate the method of manufacturing the device of FIG. 8A according to some embodiments of the invention. Like reference numerals denote like elements.

When compared to the embodiments illustrated in FIGS. 3-7, the embodiments illustrated in FIGS. 9-11 share many similarities. Accordingly, in the description of FIGS. 9-11 that appears below, exemplary processes that may be understood with reference to FIGS. 3-7 are not described in great depth and in some cases a description may be absent altogether. Thus, reference numerals for identical or similar elements shared by both the embodiments of FIGS. 3-7 and FIGS. 9-11 differ only in the most significant digit. In the description of FIGS. 9-11 that appears below, emphasis will be placed on the portions of the embodiments that are different from the embodiments illustrated in FIGS. 3-7.

Referring to FIGS. 9A and 9B, according to the operations described above with reference to FIGS. 3A and 3B, the device isolation region 405 is formed in the semiconductor substrate 400 to define the active region 410. The active region 410 extends in the $X_1$ direction, and includes a pair of tabs 410' protruding in the $X_2$ direction, similar to the layout illustrated in FIG. 3A.

Next, a photoresist pattern 415 is formed such that the tabs 410' and a portion of the active region 410 between the active region tabs 410' is exposed. In addition, the photoresist pattern 415 includes a hole tab 415' that exposes the adjacent device isolation region 405 and a portion of the active region 410 that protrudes in the $X_1$ direction.

Referring to FIGS. 10A and 10B, the exposed active region 410 is etched using the photoresist pattern as an etch protecting layer, thus forming the recess trench 420. Then, the photoresist pattern 415 is removed. The recess trench 420 includes the first hole tab 420' formed by etching the tab 410' and the second hole tab 420" formed by etching a portion of the active region 410 exposed by the photoresist pattern hole tab 415'. The second hole tab 420" extends the recess trench 420 in the $X_1$ direction.

Referring to FIGS. 11A and 11B, the gate insulating layer 425 is formed on the active region 410 and the recess trench 420. Then, a gate electrode layer (not shown) is formed on the gate insulating layer 425 and then is patterned to form the gate electrode 430. Furthermore, a gate spacer 445 is formed on the sidewalls of the gate electrode 430.

The gate electrode 430 includes the recessed portion 430*a* that partially fills the recess trench 420 and the protruding portion 430*b* that extends above the active region. The length of the protruding portion 430*b* in the $X_1$ direction may be less than the length of the recessed portion 430*a* in the $X_1$ direction. The protruding portion 430*b* may extend linearly in the $X_2$ direction. The recessed portion 430*a* includes the first tab 430*a*' that covers the recess trench first hole tab 420', as well as the second tab 430*a*" that covers the second hole tab 420'.

Subsequently, according to a method known to those skilled in the art, the gate electrode 430 is interposed between the source/drain regions (refer to 450 shown in FIG. 8) formed in the active region 410.

According to these embodiments, the width of the active region in the $X_2$ direction can be increased by the inclusion of the tab 410'. Accordingly, the widths of the recess trench 420 and the recessed portion 430*a* of the gate electrode 430 in the $X_2$ direction may be increased. In addition, the edges of the recess trench 420 and the recessed portion 430*a* of the gate electrode 430 extend in the $X_1$ direction due to the photoresist pattern hole tab 415'. As a result, the gate electrode 430 between the source/drain regions can have an inner gate structure. Accordingly, a semiconductor device manufactured in accordance with the embodiments described above has excellent junction leakage current characteristics and excellent refresh characteristics.

Figure 12A:
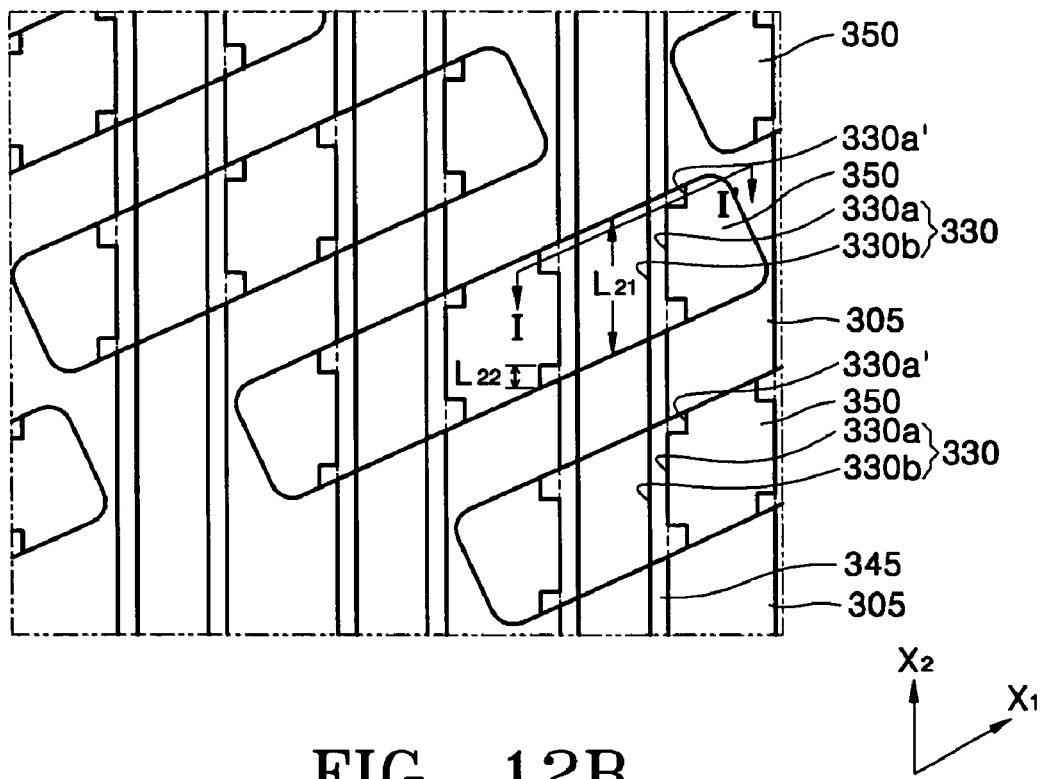
FIG. 12A is a plan diagram illustrating a recess gate-type semiconductor device according to more embodiments of the invention.
Figure 12B:
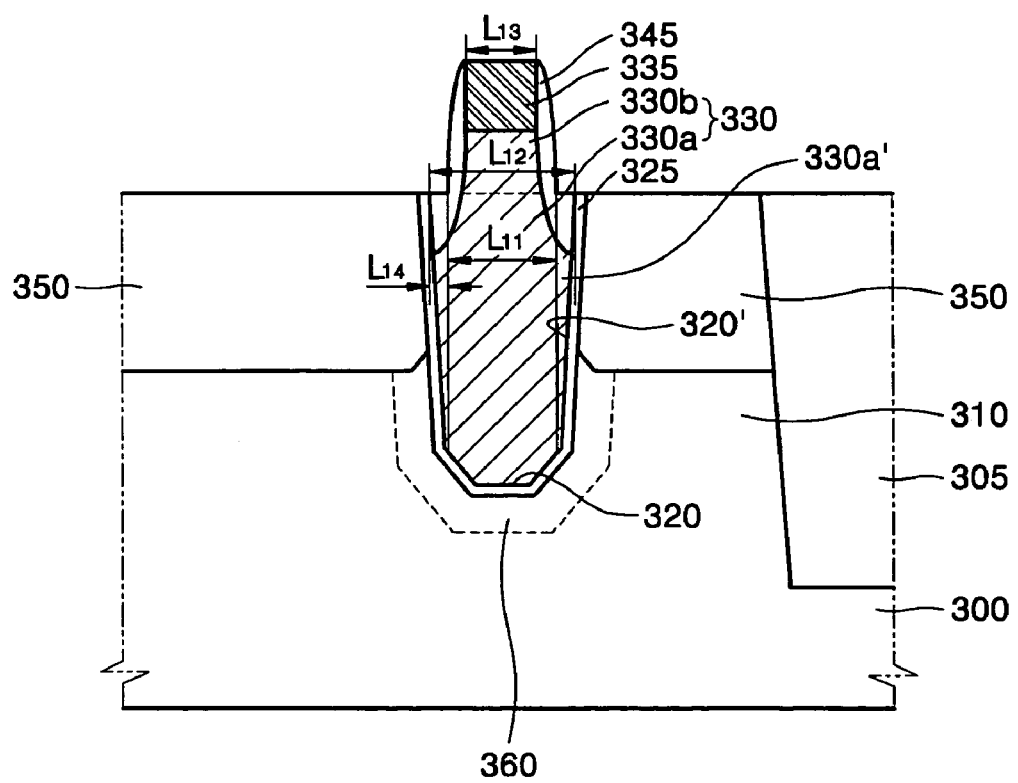
FIG. 12B is a sectional diagram, taken along line I-I' of FIG. 12A, which further illustrates the device of FIG. 12A.

FIG. 12A is a plan diagram illustrating a recess gate-type semiconductor device according to more embodiments of the invention. FIG. 12B is a sectional diagram, taken along line I-I' of FIG. 12A, which further illustrates the device of FIG. 12A. When compared to the embodiments of FIGS. 8A-8C, the embodiments illustrated in FIGS. 12A-12B share many similarities. Accordingly, in the description of FIGS. 12A-12B that appears below, the portions of the semiconductor device that may be understood with reference to FIGS. 8A-8C are not described in great depth and in some cases a description may be absent altogether. Thus, reference numerals for identical or similar elements shared by both the embodiments of FIGS. 8A-8C and FIGS. 12A-12B differ only in the most significant digit. In the description of FIGS. 12A-12B that appears below, emphasis will be placed on the portions of the embodiments that are different from the embodiments illustrated in FIGS. 8A-8C.

Unlike the embodiments of FIGS. 8A-8C, the embodiments of FIGS. 12A-12B have an active region 310 that does not include an active region tab (410' shown in FIG. 9A). For example, the active region 310 has a constant width in the $X_1$ direction.

Also, the shape of a tab 330*a*' where a recess portion 330*a*' of a gate electrode 330 is disposed may be different from the shape of the tab 430*a*' of FIGS. 8A-8C. Many suitable shapes for the recessed portion tab 330*a*' will be apparent to those of skill in the art.

The embodiments of FIGS. 12A-12B include a capping layer 335 on the gate electrode 330, whereas the embodiments of FIGS. 8A-8C do not include the capping layer. However, the capping layer 335 may be easily changed by those skilled in the art.

In the embodiments of FIGS. 12A-12B, a gate insulating layer 325 does not extend to the source/drain regions 350.

However, since this difference depends on whether or not the gate insulating layer 325 is etched during the formation of the gate electrode 330, such a modification is easily made by those skilled in the art.

In detail, the active region 310 may extend in the $X_1$ direction, and the gate electrode 330 may extend in the $X_2$ direction. To increase the integrity of the semiconductor device, the $X_1$ axis and the $X_2$ axis form an angle of 30° up to 90°, and more preferably an angle of 30° to 60°. The tab 330a' protruding in the $X_1$ direction is formed at the corner of the recessed portion 330a such that the width of the recessed portion 330a in the $X_1$ direction is increased.

The width L14 of the tab 330a' in the $X_1$ direction may be in the range of 100 Å to 300 Å, or 10% to 30% of the width L11 of the recessed portion 330a. When the width L14 is inside this range, a bridge between the recessed portions 330a does not occur and the formation of an outer gate structure may be prevented. The width L22 of the recessed portion tab 330a' in the $X_2$ direction may be in the range of 100 Å to 400 Å, or 10% to 30% of the width L21 of the recessed portion 330a in the $X_2$ direction. In this case, an increase in the width of the gate electrode 330 is prevented, and thus integrity can be increased.

The semiconductor device includes the recessed portion tab 330a' and thus has an inner gate structure. Consequently, an increase of the leakage current due to the focus of electric current and a decrease of refresh characteristics may be prevented.

Figure 13A:
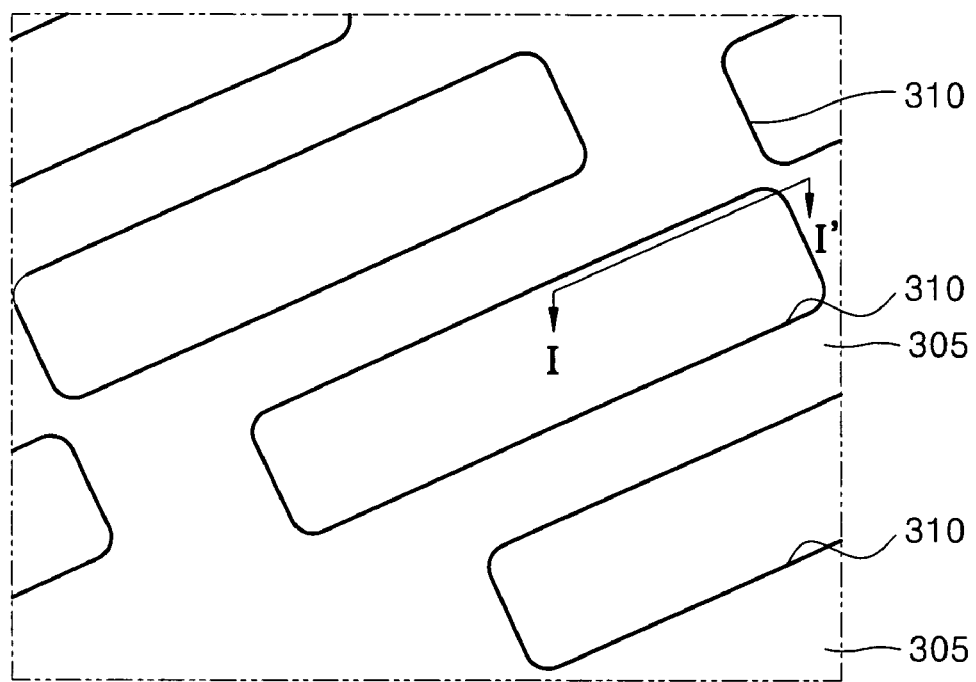
FIGS. 13A, 14A and 15A are plan diagrams illustrating a method of manufacturing the device of FIG. 12A according to more embodiments of the invention.
Figure 13B:
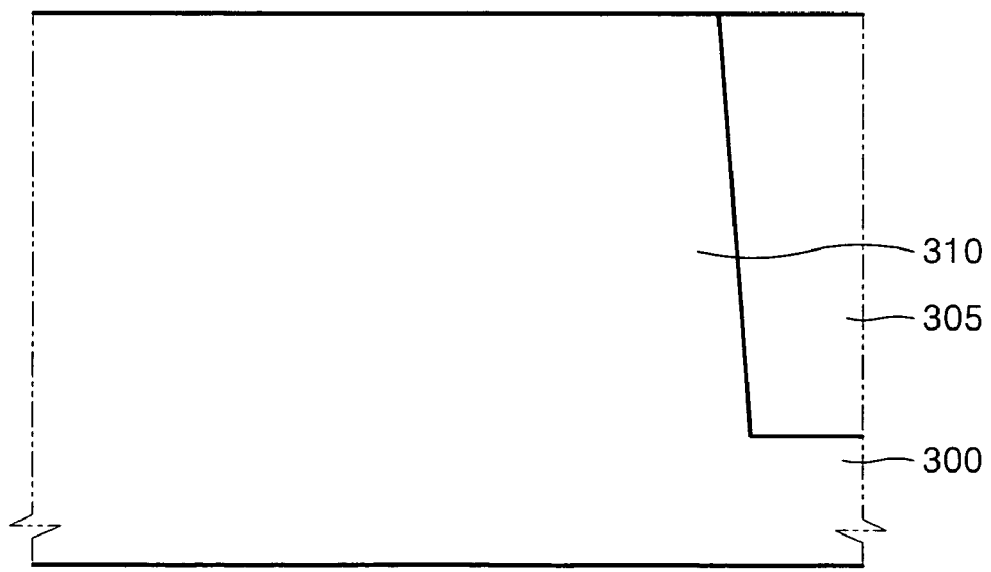
FIGS. 13B, 14B and 15B are sectional diagrams, taken along the lines I-I' of FIGS. 13A, 14A and 15A, respectively, which further illustrate the method of manufacturing the device of FIG. 12A according to more embodiments of the invention.
Figure 14A:
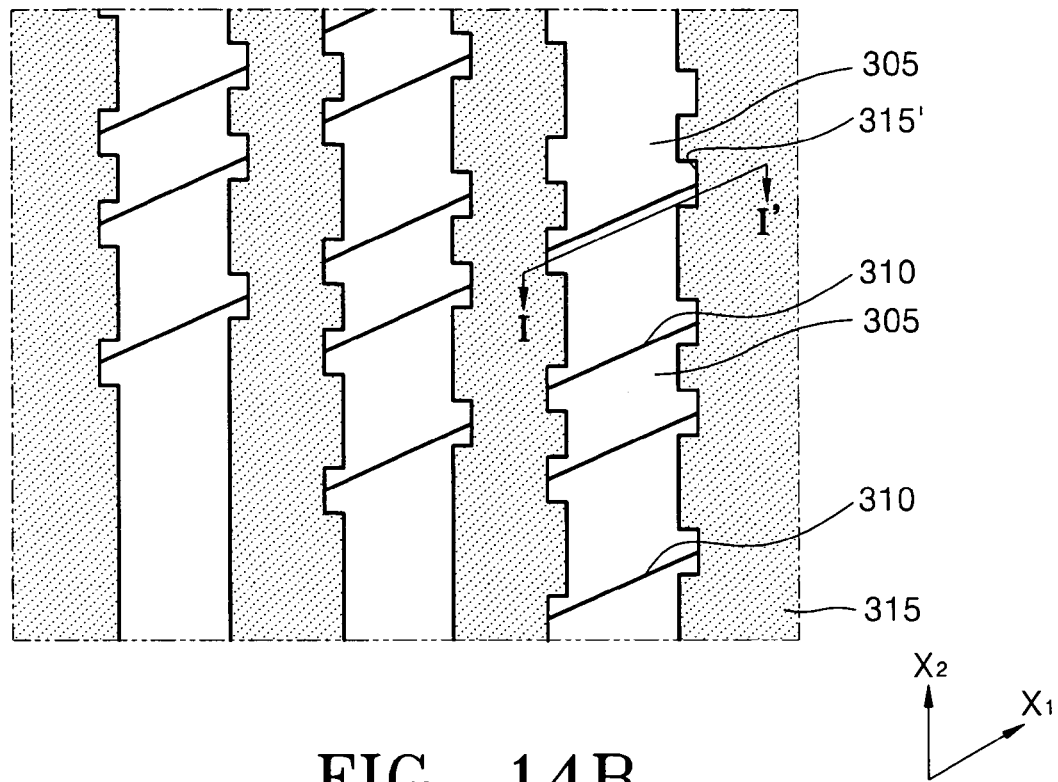
Figure 14B:
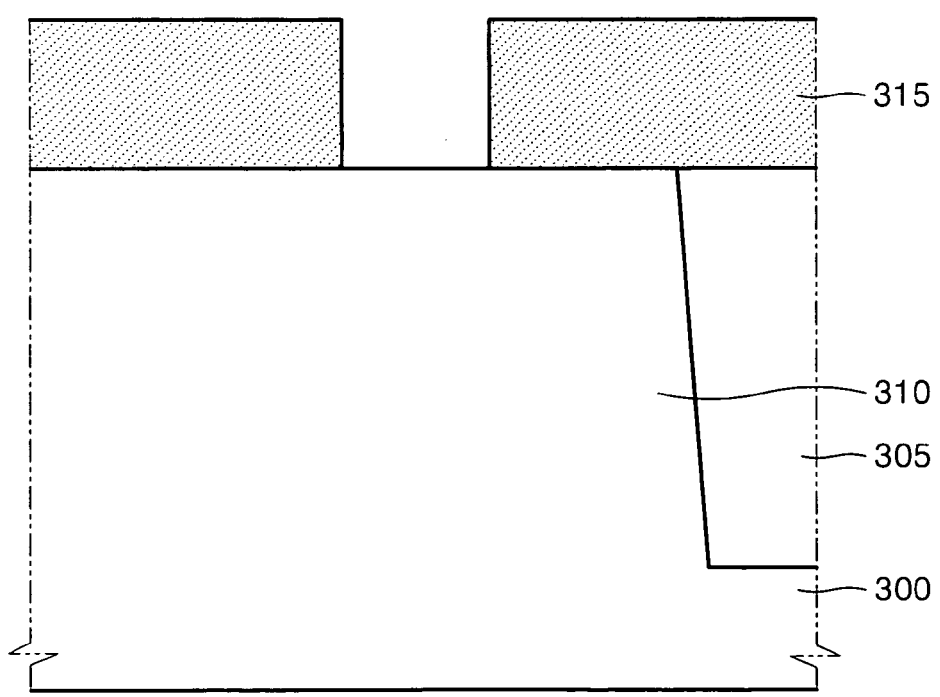
Figure 15A:
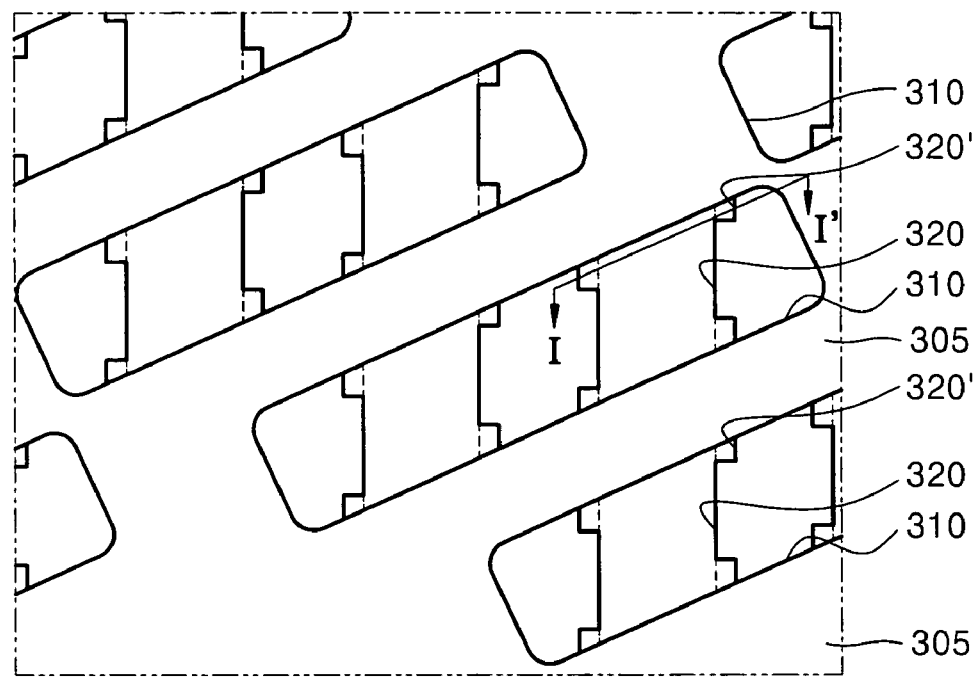
Figure 15B:
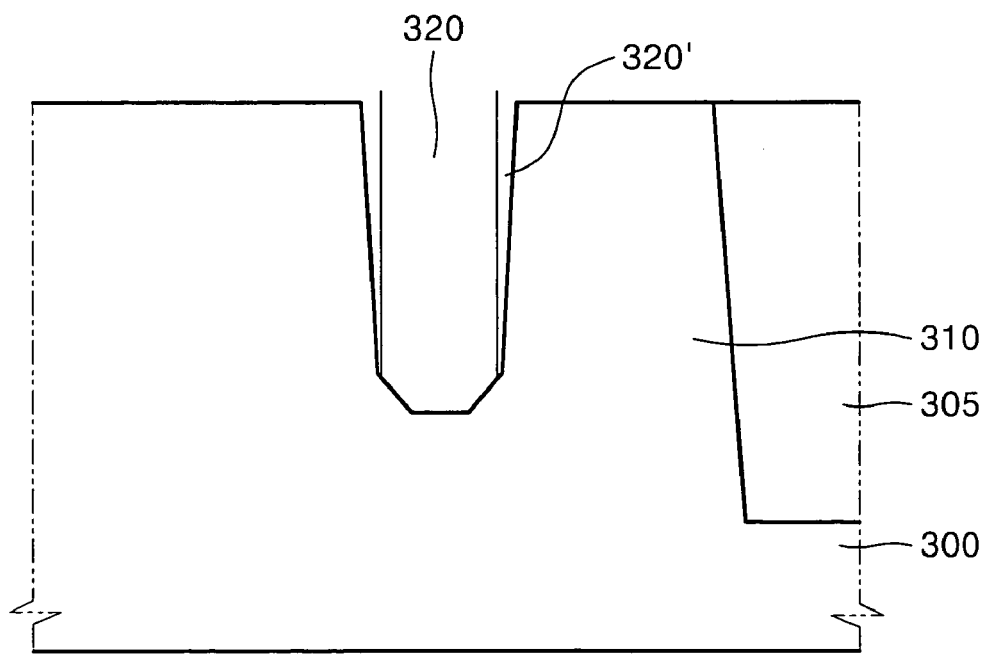

FIGS. 13A, 14A and 15A are plan diagrams illustrating a method of manufacturing the device of FIG. 12A according to more embodiments of the invention. FIGS. 13B, 14B and 15B are sectional diagrams, taken along the lines I-I' of FIGS. 13A, 14A and 15A, respectively, which further illustrate the method of manufacturing the device of FIG. 12A according to more embodiments of the invention.

When compared to the embodiments illustrated in FIGS. 3-7 and FIGS. 9-11, the embodiments illustrated in FIGS. 13-15 share many similarities. Accordingly, in the description of FIGS. 13-15 that appears below, exemplary processes that may be understood with reference to FIGS. 3-7 and FIGS. 9-11 are not described in great depth and in some cases a description may be absent altogether. Thus, reference numerals for identical or similar elements shared by the embodiments of FIGS. 3-7, FIGS. 9-11 and FIGS. 13-15 differ only in the most significant digit. In the description of FIGS. 13-15 that appears below, emphasis will be placed on differences between the embodiments.

Referring to FIGS. 13A and 13B, the device isolation region 305 is formed in the semiconductor substrate 300 to define the active region 310 that extends in the $X_1$ direction. The device isolation region 305 can be formed by forming a trench in a predetermined region of the semiconductor substrate 300, covering the trench with an insulating layer, such as an oxide layer, and then planarizing the insulating layer.

Referring to FIGS. 14A and 14B, a photoresist pattern 315 used to form a recess trench is formed on the resulting structure including the active region 310. The photoresist pattern 315 exposes a region where the recess trench is to be formed and the adjacent device isolation region 305. The photoresist pattern 315 extends in the $X_2$ direction, and includes a hole tab 315'. The width of the hole tab 315' in the $X_1$ direction may be in the range of 100 Å to 300 Å, and the width of the hole tab 315' in the $X_2$ direction may be in the range of 200 Å to 600 Å.

Referring to FIGS. 15A and 15B, using the photoresist pattern 315 as an etch protecting layer, the semiconductor substrate 300 is selectively etched to form the recess trench 320. Subsequently, the photoresist pattern 315 is removed to expose the active region 310 having the recess trench 320.

For example, the operation of etching may be performed with a high etch selectivity between the semiconductor substrate 300 and the device isolation region 305 such that the device isolation region 305 exposed by the photoresist pattern 315 is not etched and only the exposed semiconductor substrate 300 is etched. The etch selectivity may be controlled using an etch gas. The recess trench 320 includes the tab 320' formed by etching a portion of the active region 310 exposed by the tab 315' of the photoresist pattern 315, and thus the width of the recess trench 320 in the $X_1$ direction is increased by the tab 320'.

Then, referring to FIGS. 11A and 11B, a gate insulating layer 325 and a gate electrode 320 are formed. At this time, the capping layer 335 may be further formed on the gate electrode 330. Then, a source/drain regions 350 separated by the gate electrode 330 is formed in the active region 310.

In addition, an interconnection structure can be further formed using a conventional method known to those skilled in the art.

The invention may be practiced in many ways. What follows are exemplary, non-limiting descriptions of some embodiments of the invention.

A recess gate-type semiconductor device according to some embodiments includes an active region that is defined by a device isolation region of the semiconductor substrate and that includes a recess trench, which is separated from the sidewalls of the device isolation region in a first direction and contacts the sidewalls of the device isolation region in a second direction; a gate insulating layer formed on at least a portion of the active region in the recess trench; a gate electrode that includes a recessed portion at least partially filling the recess trench and is formed on the gate insulating layer; and source/drain regions that are separated by the gate electrode and formed in the active region, wherein the width of the recess trench in the second direction is greater than the width of the source/drain regions in the second direction.

The gate electrode may further include a protruding portion connected to the recessed portion on the active region. The width of the protruding portion of the gate electrode in the first direction may be less than the width of the recessed portion of the gate electrode in the first direction.

The recess trench may have first hole tabs such that the width between ends of the recess trench contacting the device isolation region in the second direction is greater than the width of the source/drain regions in the second direction.

The recess trench may further include second hole tabs so that the width between ends of the recess trench contacting the source/drain regions is increased in the first direction.

According to other embodiments, a recess gate-type semiconductor device includes an active region that is defined by a device isolation region of the semiconductor substrate and includes a recess trench, which is separated from the sidewalls of the device isolation region in a first direction and contacts the sidewalls of the device isolation region in a second direction; a gate insulating layer formed on at least a portion of the active region in the recess trench; a gate electrode including a recessed portion at least partially filling the recess trench of the active region formed on the gate insulating layer; and source/drain regions that are separated by the gate electrode and formed in the active region The recess trench of the active region has first hole tabs such that the width between ends of the recess trench contacting the device isolation region in the second direction is greater than the width of the source/drain regions in the second direction, and second hole tabs that increase the width between edges of the recess trench contacting the source/drain regions in an first direction.

According to still other embodiments, a recess gate-type semiconductor device includes an active region that is defined by a device isolation region of the semiconductor substrate and includes a recess trench, which is separated from the sidewalls of the device isolation region in a first direction and contacts the sidewalls of the device isolation region in a second direction; a gate insulating layer formed on the active region in the recess trench; a gate electrode including a recessed portion at least partially filling the recess trench formed on the gate insulating layer; and source/drain regions separated by the gate electrode formed in the active region, wherein the recess trench has hole tabs protruding into the source/drain regions in the first direction, and the recessed portion of the gate electrode further includes tabs covering the hole tabs of the recess trench.

According to additional embodiments, a method of manufacturing a recess gate-type semiconductor device includes forming a device isolation region in a semiconductor substrate to define an active region which extends in a first direction and includes a pair of facing tabs protruding in a second direction; forming a photoresist pattern such that a portion of the active region between the facing tabs is exposed; etching the exposed active region using the photoresist pattern as an etch protecting layer to form a recess trench; forming a gate insulating layer on the active region in the recess trench; and forming a gate electrode including a recessed portion at least partially filling the recess trench of the active region on the gate insulating layer.

The photoresist pattern may have hole tabs that exposes a portion of the active region connecting the facing tabs of the active region.

According to different embodiments, a method of manufacturing a recess gate-type semiconductor device includes forming a device isolation region in the semiconductor substrate to define an active region extending in a first direction; forming a recess trench that has hole tabs protruding in the first direction at the corners of the recess trench, is separated from sidewalls of the device isolation region in the first direction, contacts sidewalls of the device isolation region in the second direction, and is formed in the active region, wherein at least an edge of each of the hole tabs contacts the device isolation region; forming a gate insulating layer on the active region in the recess trench; and forming a gate electrode including a recessed portion at least partially filling the recess trench of the active region.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A semiconductor device comprising:
    a semiconductor substrate having an active region and a device isolation region, the active region including a recess trench, wherein a portion of the recess trench is separated from a sidewall of the device isolation region in a first direction and contacts a sidewall of the device isolation region in a second direction;
    a gate insulating layer disposed on a surface of the recess trench;
    a gate electrode disposed on the gate insulating layer and having a recessed portion that at least partially fills the recess trench; and
    source/drain regions disposed in the active region and separated by the gate electrode, wherein the recess trench comprises first hole tabs, each first hole tab disposed at an end of the recess trench, the first hole tabs disposed in parallel to each other such that a width of the recess trench in the second direction is greater than a width of the source/drain regions in the second direction.

2. The semiconductor device of claim 1, the gate electrode further comprising a protruding portion that extends above a surface of the active region.

3. The semiconductor device of claim 2, wherein a width of the protruding portion in the first direction is less than a width of the recessed portion in the first direction.

4. The semiconductor device of claim 1, wherein a width of the first hole tabs in the first direction is equal to a width of a non-tab portion of the recess trench in the first direction.

5. The semiconductor device of claim 4, the recess trench further comprising second hole tabs, a width of the second hole tabs in the first direction greater than the width of the first hole tabs in the first direction and greater than the width of the non-tab portion of the recess trench in the first direction.

6. The semiconductor device of claim 5, where edges of the second hole tabs are disposed in contact with the device isolation region.

7. A semiconductor device comprising:
    a semiconductor substrate having an active region and a device isolation region, the active region including a recess trench, wherein a portion of the recess trench is separated from a sidewall of the device isolation region in a first direction and contacts a sidewall of the device isolation region in a second direction;
    a gate insulating layer disposed on a surface of the recess trench;
    a gate electrode, the gate electrode including a recessed portion that at least partially fills the recess trench; and
    source/drain regions that are disposed in the active region and separated by the gate electrode, the recess trench having first hole tabs such that a width between ends of the recess trench contacting the device isolation region in the second direction is greater than a width of the source/drain regions in the second direction, the recess trench also having second hole tabs structured to increase a width of the recess trench in first direction.

8. The semiconductor device of claim 7, wherein a width of the first hole tabs in the first direction are equal to a width of a non-tab portion of the recess trench in the first direction.

9. The semiconductor device of claim 7, the second hole tabs having edges that are in contact with the device isolation region.

10. The semiconductor device of claim 7, the gate electrode further comprising a protruding portion that extends above the active region and that is connected to the recessed portion.

11. The semiconductor device of claim 10, a width of the protruding portion in the first direction less than a width of the recessed portion in the first direction.

12. A semiconductor device comprising:
    a semiconductor substrate having an active region and a device isolation region, the active region including a recess trench, wherein a portion of the recess trench is separated from a sidewall of the device isolation region in a first direction and contacts a sidewall of the device isolation region in a second direction;

a gate insulating layer disposed on at least a surface of the recess trench;

a gate electrode, the gate electrode including a recessed portion that at least partially fills the recess trench; and source/drain regions that are disposed in the active region and separated by the gate electrode, the recess trench having hole tabs that protrude into the source/drain regions in the first direction, the recessed portion further including tabs that cover the hole tabs.

13. The semiconductor device of claim 12, a width of the tabs in the first direction being about 10% to 30% of a width of the recessed portion in the first direction.

14. The recess gate-type semiconductor device of claim 12, wherein the widths of the tabs of the recessed portion of the gate electrode in the second direction are in the range of 10% to 30% of the width of the recessed portion of the gate electrode in the second direction.

15. The semiconductor device of claim 12, the gate electrode further comprising a protruding portion extending above the active region.

16. The semiconductor device of claim 15, a width of the protruding portion in the first direction less than a width of the recessed portion in the first direction.

* * * * *